(12) United States Patent
Cho et al.

(10) Patent No.: US 11,390,113 B2
(45) Date of Patent: Jul. 19, 2022

(54) DECORATION MEMBER AND METHOD FOR MANUFACTURING DECORATION MEMBER

(71) Applicant: LG CHEM, LTD., Seoul (KR)

(72) Inventors: Eun Byurl Cho, Daejeon (KR); Yong Chan Kim, Daejeon (KR); Ki Hwan Kim, Daejeon (KR); Jeong Woo Shon, Daejeon (KR); Jin Suk Song, Daejeon (KR); Song Ho Jang, Daejeon (KR); Pilsung Jo, Daejeon (KR); Sangcholl Han, Daejeon (KR); Nansra Heo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/465,103

(22) PCT Filed: Mar. 6, 2018

(86) PCT No.: PCT/KR2018/002670
§ 371 (c)(1),
(2) Date: May 29, 2019

(87) PCT Pub. No.: WO2018/164462
PCT Pub. Date: Sep. 13, 2018

(65) Prior Publication Data
US 2019/0291504 A1  Sep. 26, 2019

(30) Foreign Application Priority Data

Mar. 6, 2017  (KR) .................. 10-2017-0028261
Oct. 20, 2017 (KR) .................. 10-2017-0136790
Nov. 28, 2017 (KR) .................. 10-2017-0160298

(51) Int. Cl.
*B44F 1/10*   (2006.01)
*C23C 14/20*  (2006.01)
(Continued)

(52) U.S. Cl.
CPC .................. *B44F 1/10* (2013.01); *B32B 3/26* (2013.01); *B32B 7/023* (2019.01); *B32B 27/16* (2013.01);
(Continued)

(58) Field of Classification Search
CPC ......... B32B 27/00; B32B 27/16; B32B 27/20; B32B 2451/00; B32B 3/30; B32B 3/26; B32B 33/00; B32B 7/023
See application file for complete search history.

(56) References Cited

U.S. PATENT DOCUMENTS 3,365,350 A * 1/1968 Cahn .................. G03C 9/00
428/29
6,264,336 B1 * 7/2001 Epstein ............ G02F 1/133553
359/599

(Continued)

FOREIGN PATENT DOCUMENTS

CN        2056903 U     5/1990
CN      101666886 A     3/2010
(Continued)

OTHER PUBLICATIONS

Office Action of Japanese Patent Office in Appl'n No. 2019-524888, dated Jul. 21, 2020.
(Continued)

*Primary Examiner* — Michael Zhang
(74) *Attorney, Agent, or Firm* — Dentons US LLP

(57) ABSTRACT

The disclosed relates to a decoration element and a method for preparing the decoration element. The decoration element has dichroism expressing different colors depending on a viewing direction, and has improved visibility of the dichroism.

12 Claims, 13 Drawing Sheets

(51) Int. Cl.

| | |
|---|---|
| *C23C 14/24* | (2006.01) |
| *C23C 14/34* | (2006.01) |
| *B32B 7/023* | (2019.01) |
| *B32B 3/26* | (2006.01) |
| *B32B 27/16* | (2006.01) |
| *B32B 27/20* | (2006.01) |
| *B32B 33/00* | (2006.01) |
| *G02B 5/22* | (2006.01) |
| *B32B 15/04* | (2006.01) |
| *B32B 27/00* | (2006.01) |

(52) U.S. Cl.
CPC ............. *B32B 27/20* (2013.01); *B32B 33/00* (2013.01); *C23C 14/205* (2013.01); *C23C 14/24* (2013.01); *C23C 14/34* (2013.01); *B32B 15/04* (2013.01); *B32B 27/00* (2013.01); *B32B 2255/20* (2013.01); *B32B 2311/04* (2013.01); *B32B 2311/16* (2013.01); *B32B 2311/18* (2013.01); *B32B 2311/24* (2013.01); *B32B 2311/30* (2013.01); *B32B 2313/04* (2013.01); *B32B 2451/00* (2013.01); *G02B 5/22* (2013.01)

(56) References Cited

U.S. PATENT DOCUMENTS

| | | |
|---|---|---|
| 7,187,487 B2 | 3/2007 | Przybyla et al. |
| 7,719,767 B2 | 5/2010 | Lin et al. |
| 7,923,122 B2 | 4/2011 | Korechika et al. |
| 2003/0184866 A1 | 10/2003 | Mimura et al. |
| 2005/0024754 A1* | 2/2005 | Epstein .................. G02B 5/09 359/831 |
| 2005/0141094 A1 | 6/2005 | Wild et al. |
| 2008/0206495 A1* | 8/2008 | Korechika ............... G02B 5/09 428/30 |
| 2010/0060987 A1 | 3/2010 | Witzman et al. |
| 2012/0064303 A1 | 3/2012 | Yashiki et al. |
| 2012/0068450 A1 | 3/2012 | Macpherson et al. |
| 2013/0048072 A1 | 2/2013 | Choi |
| 2014/0104690 A1 | 4/2014 | Sandre-Chardonnal |
| 2016/0052227 A1 | 2/2016 | Hara et al. |
| 2019/0381761 A1* | 12/2019 | Cho ........................ B32B 27/16 |

FOREIGN PATENT DOCUMENTS

| | | |
|---|---|---|
| CN | 102460236 A | 5/2012 |
| CN | 102971862 A | 3/2013 |
| CN | 105102211 A | 11/2015 |
| JP | 10-71668 A | 3/1998 |
| JP | 11-300920 A | 11/1999 |
| JP | 2001-264525 A | 9/2001 |
| JP | 2002-108221 A | 4/2002 |
| JP | 2006-504545 A | 2/2006 |
| JP | 2008-083599 A | 4/2008 |
| JP | 2009-80205 A | 4/2009 |
| JP | 2009-168928 A | 7/2009 |
| JP | 2009-291966 A | 12/2009 |
| JP | 2010-197798 A | 9/2010 |
| JP | 2011-140136 A | 7/2011 |
| JP | 2011-173379 A | 9/2011 |
| JP | 5493203 B2 | 5/2014 |
| KR | 10-2008-0078523 A | 8/2008 |
| KR | 10-0953696 B1 | 4/2010 |
| KR | 10-2013-0077567 A | 7/2013 |
| KR | 10-1452140 B1 | 10/2014 |
| KR | 10-1629887 B1 | 6/2016 |
| KR | 10-2016-0080748 A | 7/2016 |
| KR | 10-1764104 B1 | 7/2017 |
| WO | 2001003945 A1 | 1/2001 |
| WO | WO-0131393 A1 * | 5/2001 ....... G02F 1/133553 |

OTHER PUBLICATIONS

Office Action of Chinese Patent Office in Appl'n No. 201880015954.6, dated Sep. 29, 2020.

Mokizycki, et al. 2012.Color Difference Delta E-A Survey. Machine Graphic & Vision.

Office Action of Japanese Patent Office in Appl'n No. 2019-524921, dated Jan. 5, 2021.

* cited by examiner

[FIG. 1]
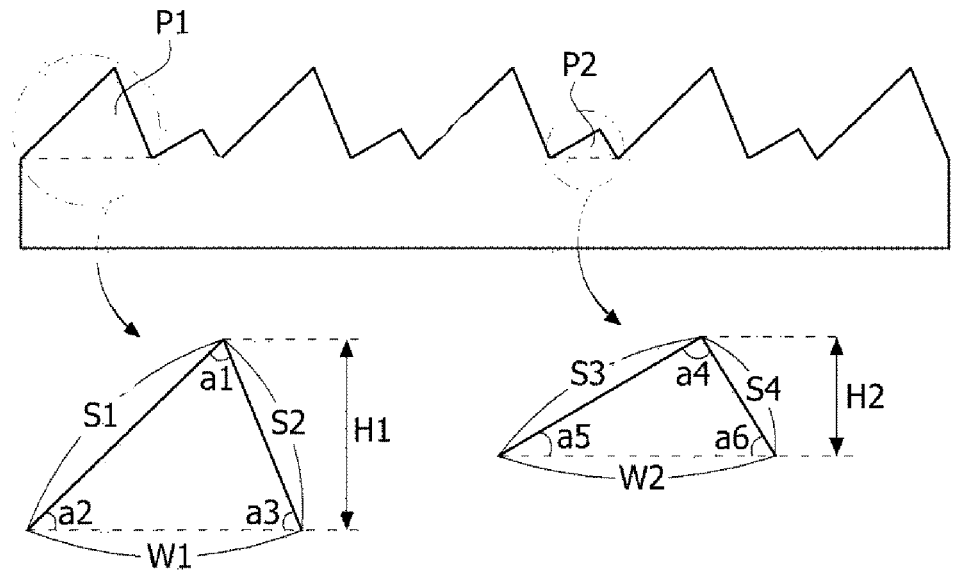
[FIG. 2]
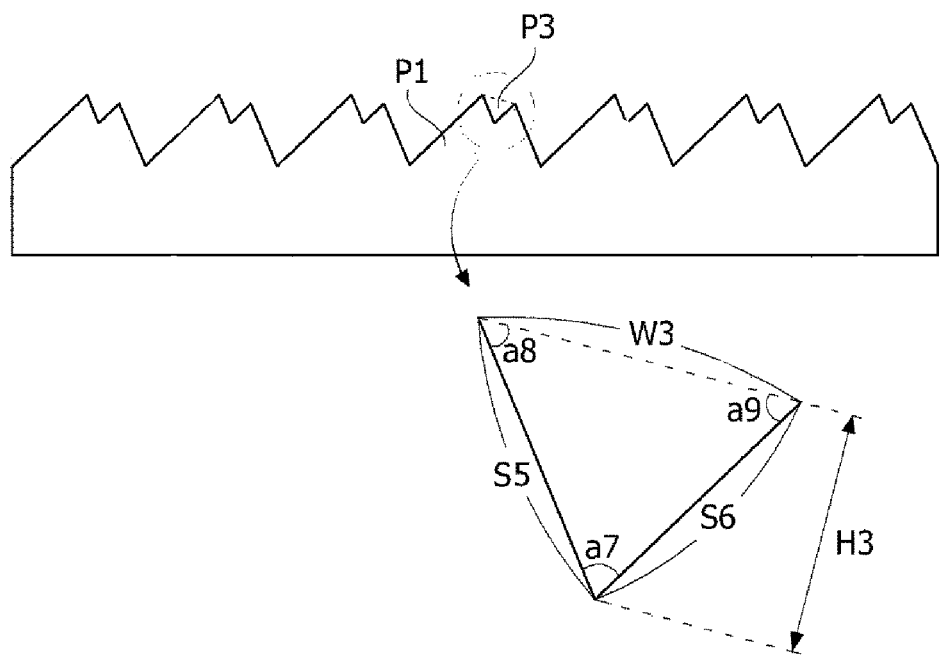

[FIG. 3]
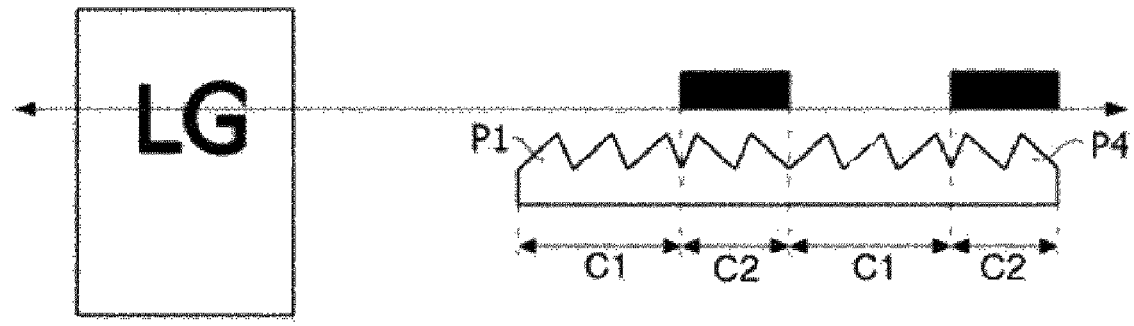
Cross-Sectional view
(a)
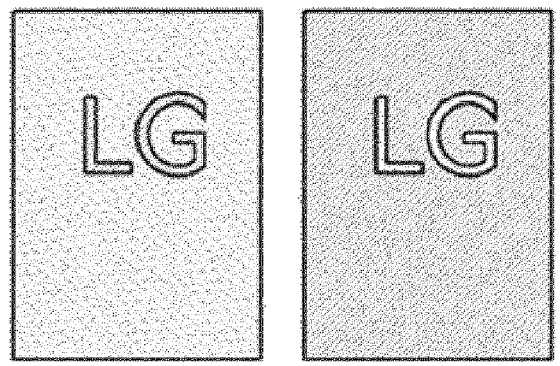
Left-side view     Right-side view
(b)
[FIG. 4]
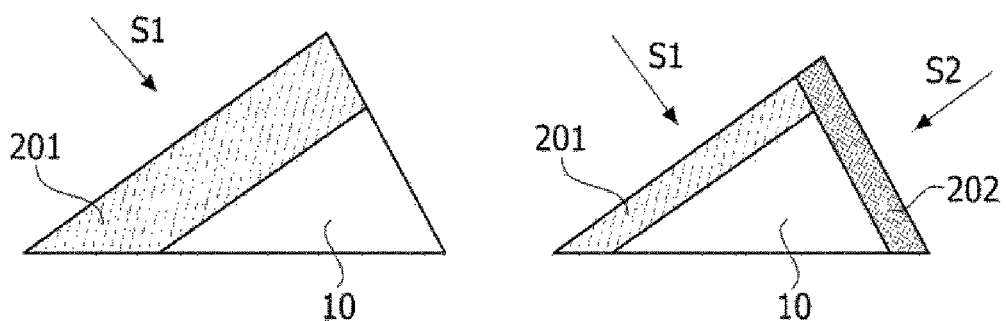

[FIG. 5]
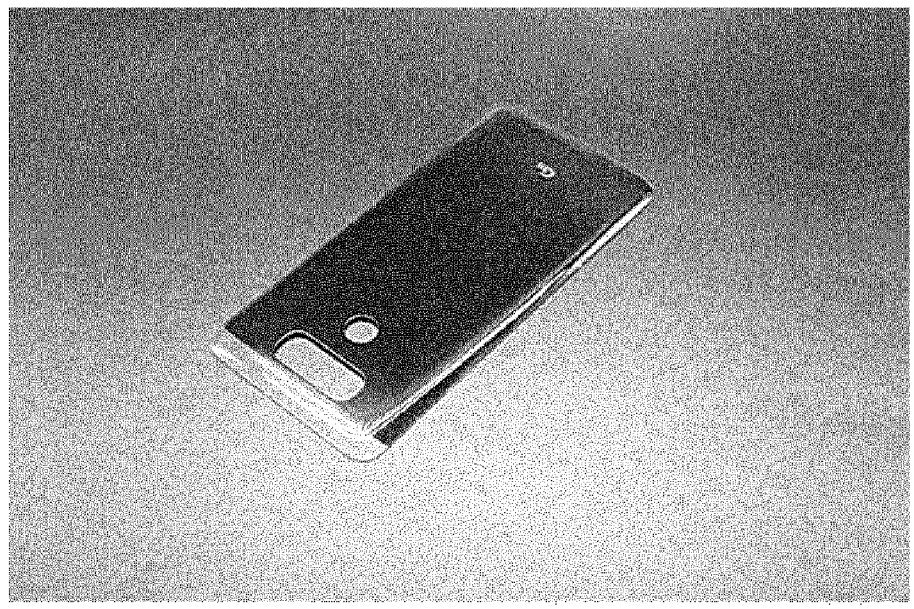
(a)
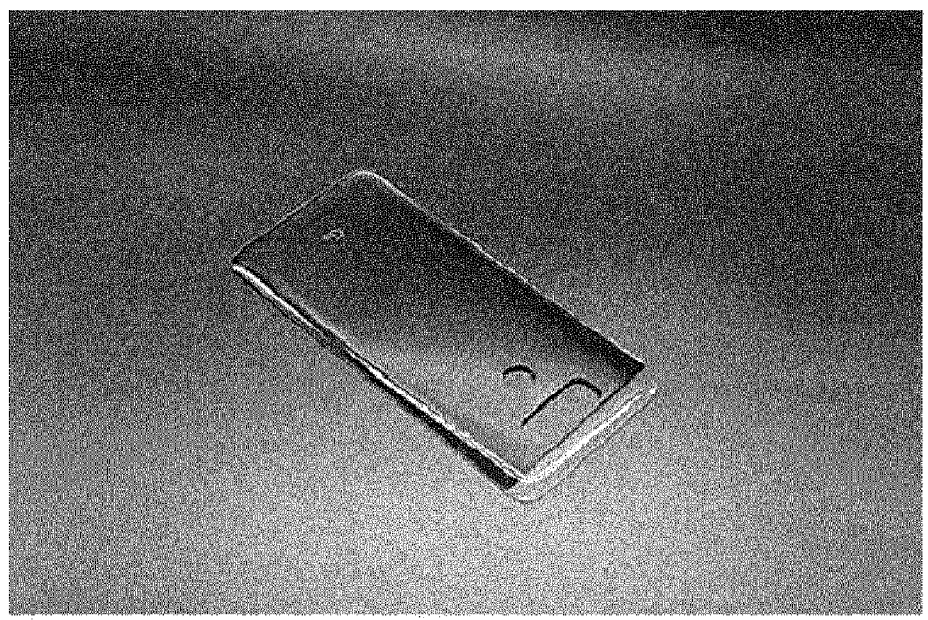
(b)

[FIG. 6]
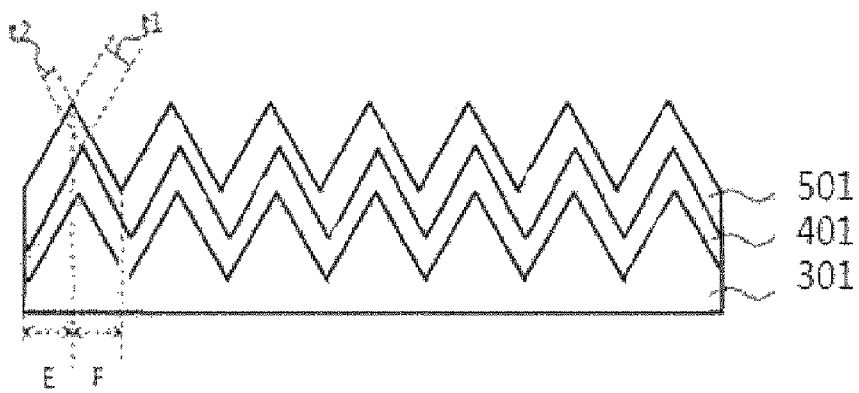
[FIG. 7]
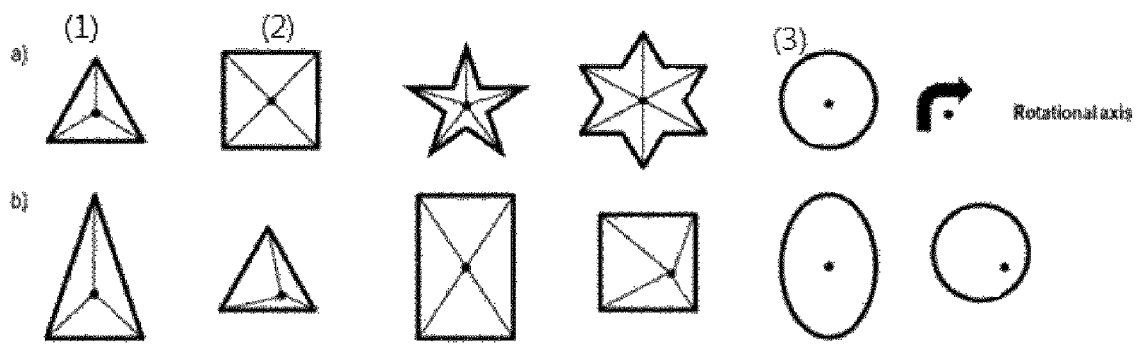
(1) Equilateral Triangle Pyramid
(2) Square Pyramid
(3) Circular Cone
[FIG. 8]
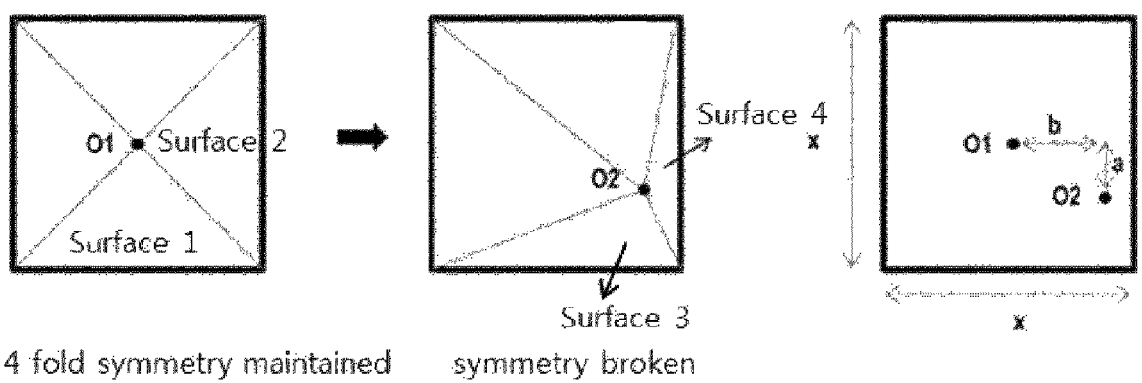
4 fold symmetry maintained    symmetry broken

[FIG. 9]
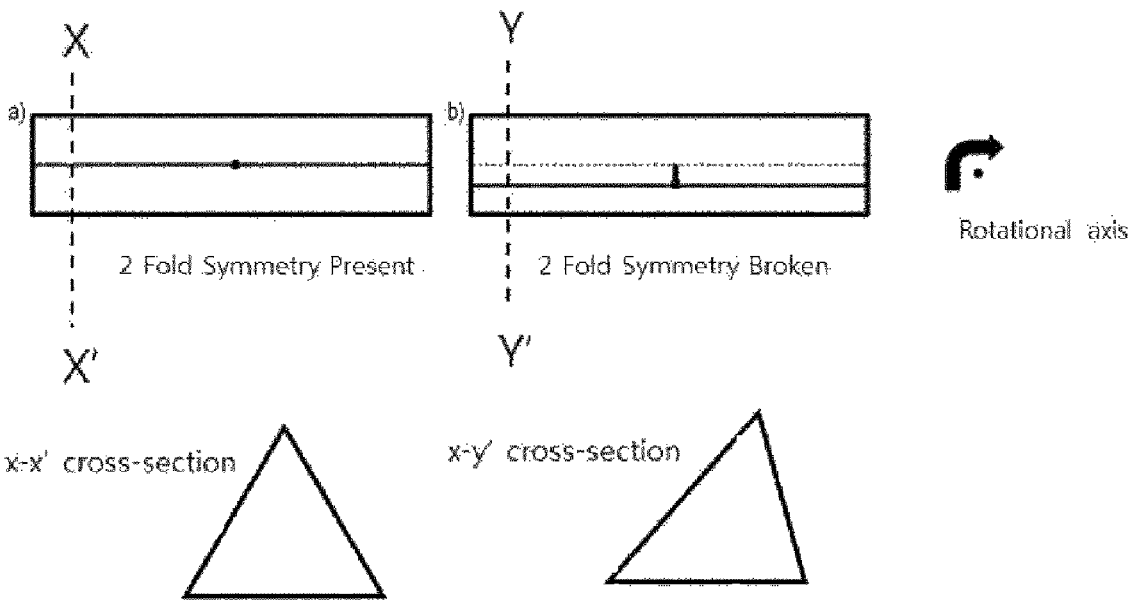
[FIG 10]
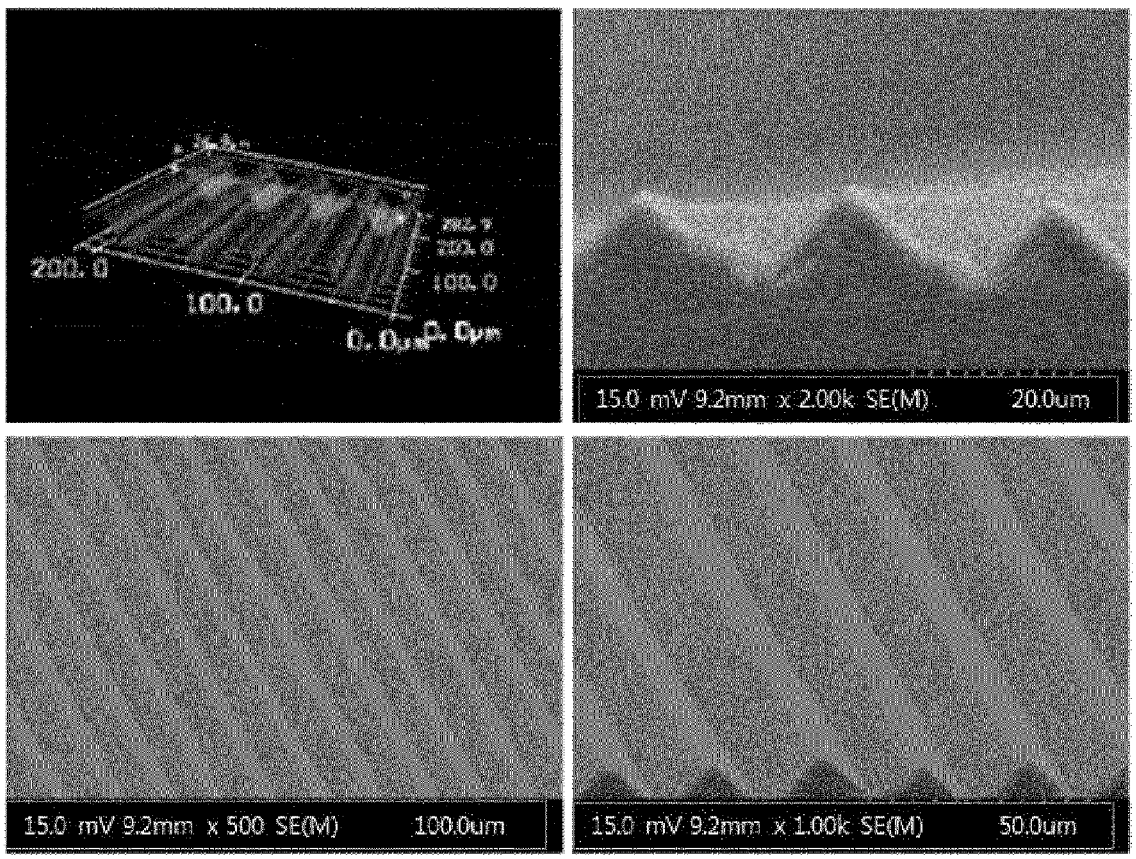

[FIG. 11]
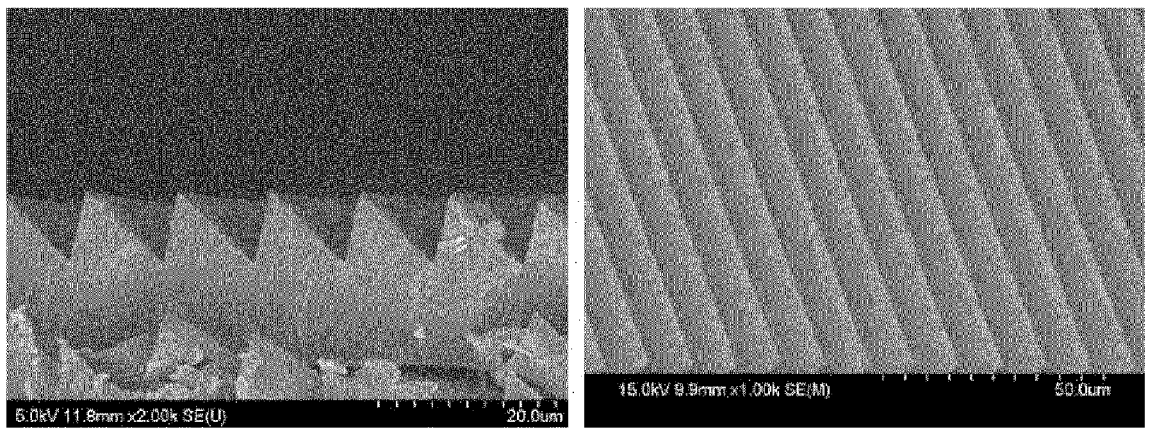
[FIG. 12]
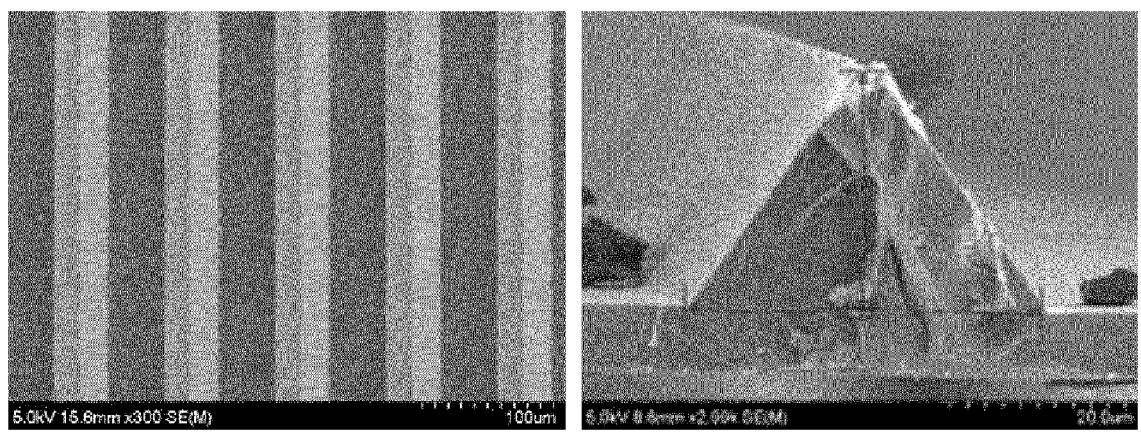
[FIG. 13]
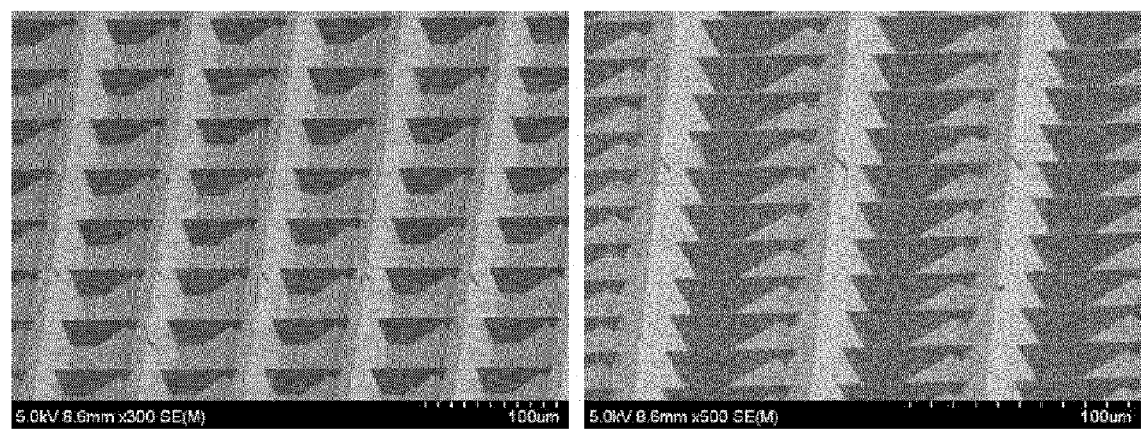

[FIG 14]
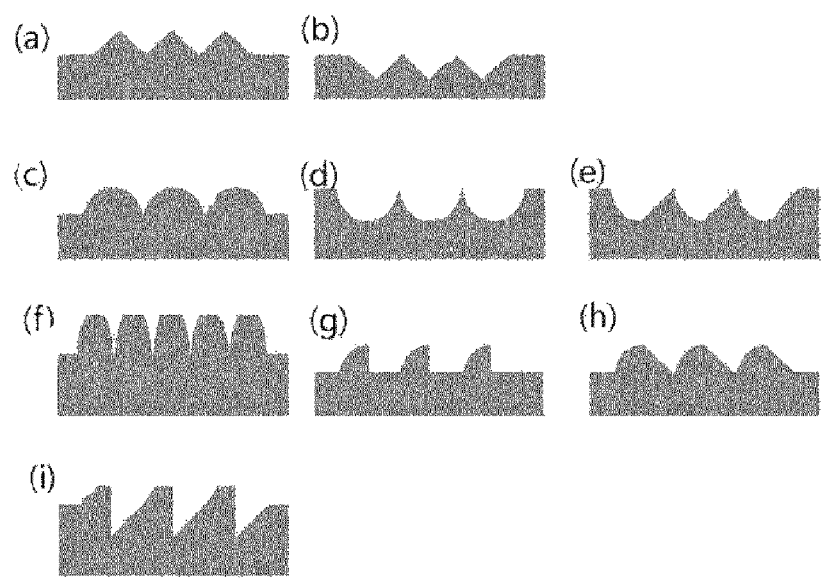

[FIG. 15]
(a) Example 5
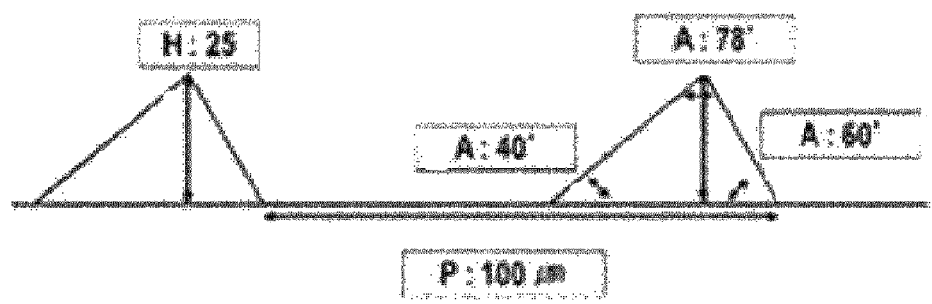
(b) Example 6
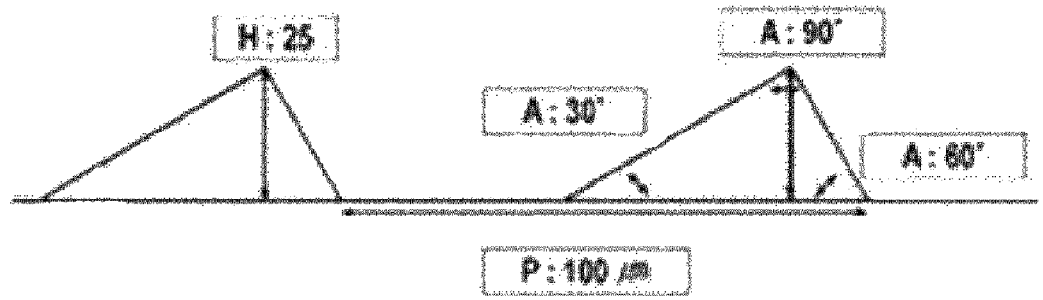
(c) Example 7
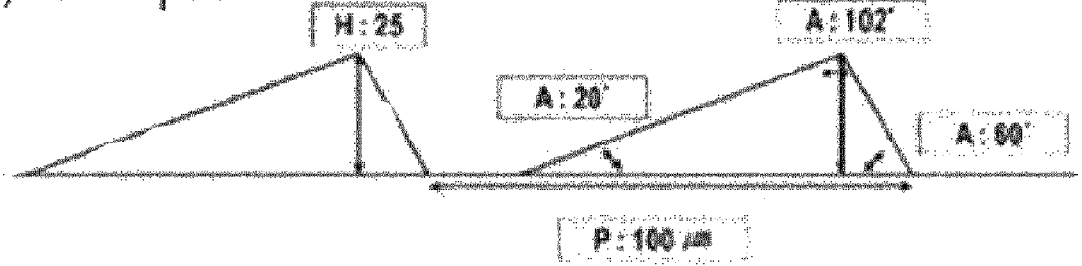

[FIG. 16]
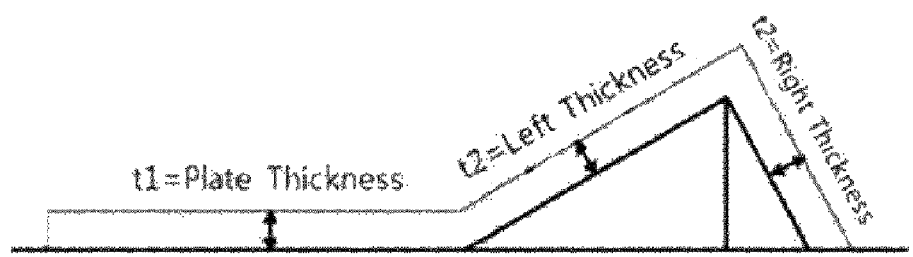
|  | Left ||| Right |||
|---|---|---|---|---|---|---|
|  | Angle (°) | Thickness (nm) | Color (CIE L*ab) | Angle(°) | Thickness (nm) | Color (CIE L*ab) |
| Example 5 | 40 | 50 | 22,4,4 | 60 | 35 | 48,13,23 |
| Example 6 | 30 | 60 | 36,2,7 | 60 | 35 | 48,13,23 |
| Example 7 | 20 | 66 | 28,1,-11 | 60 | 35 | 48,13,23 |

[FIG. 17]
Thin film structure
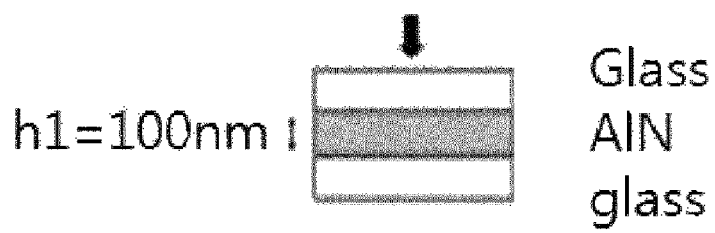
Viewing Angle-dependent Color Change
Example 1  Comparative Example 1
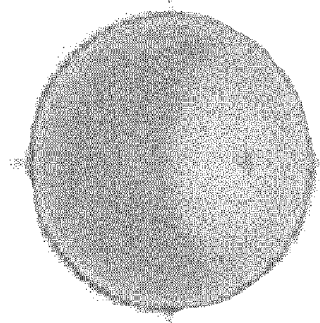 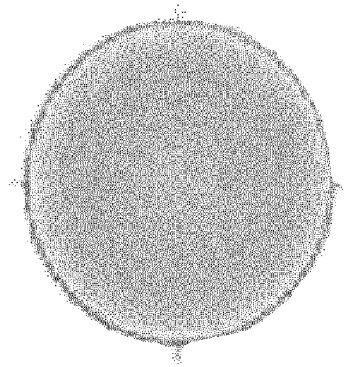

[FIG. 18]
Changes in Lab values depending on Viewing angle
Example 1
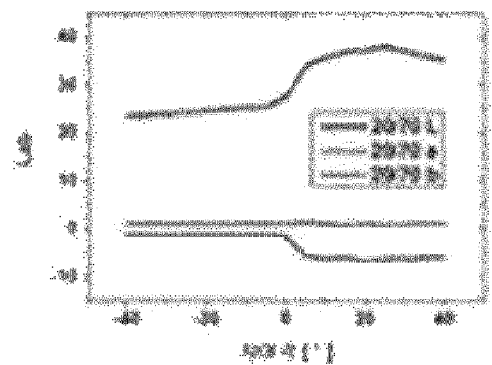
Viewing angle
Comparative Example 1
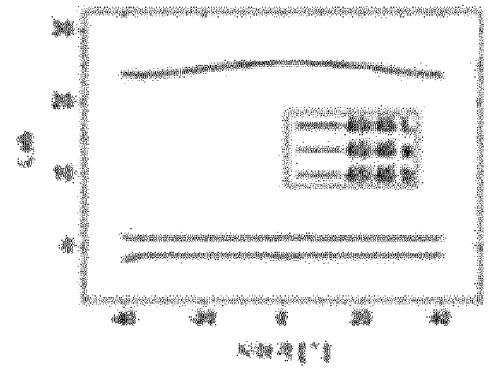
viewing angle
[FIG. 19]
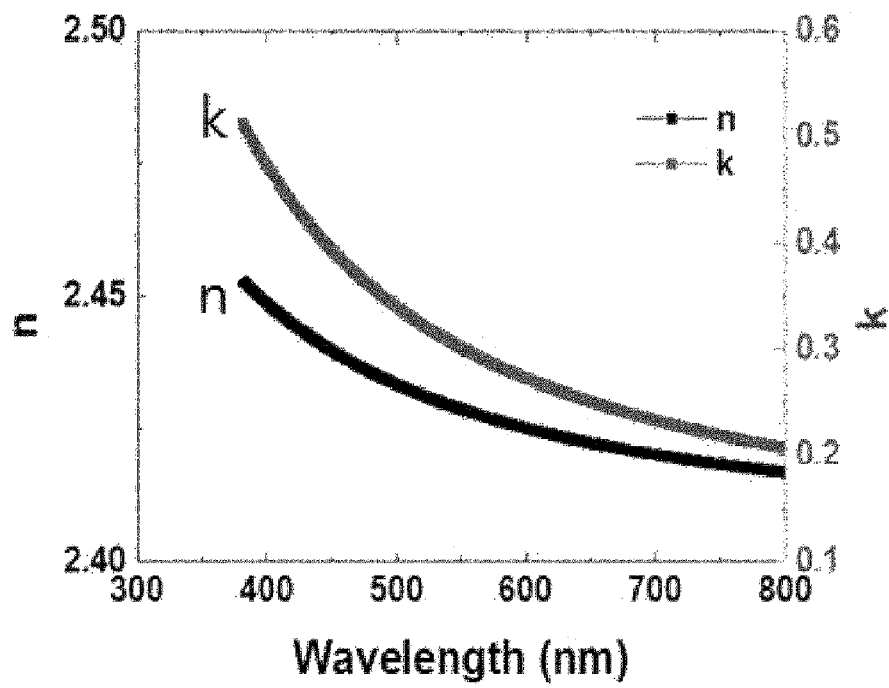

【FIG 20】
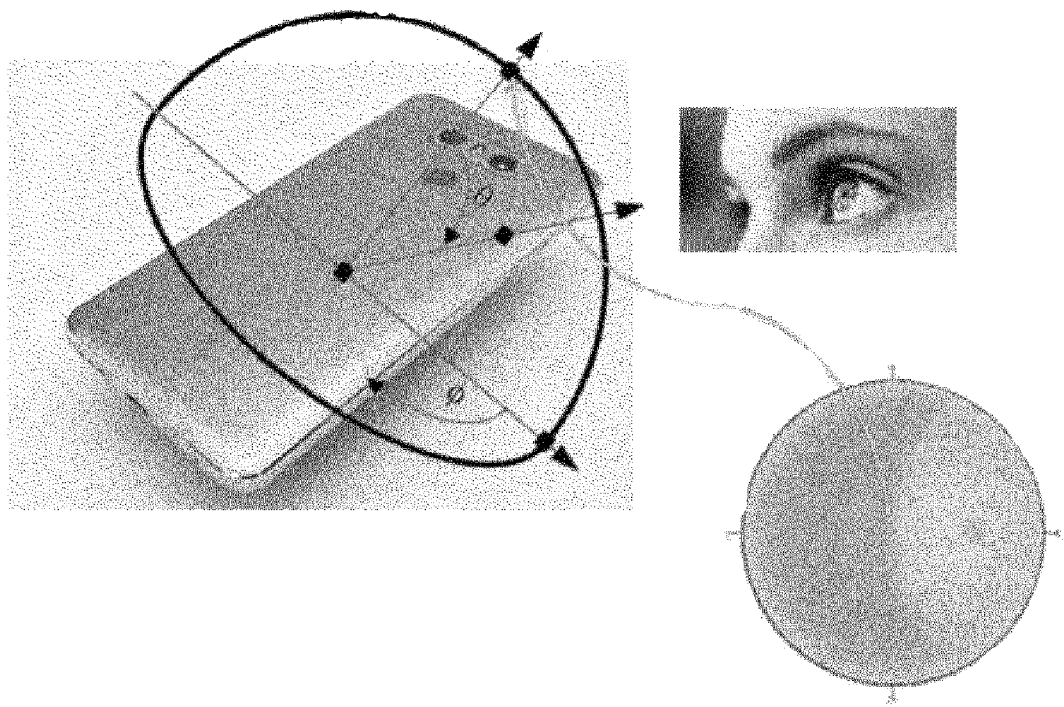
【FIG 21】
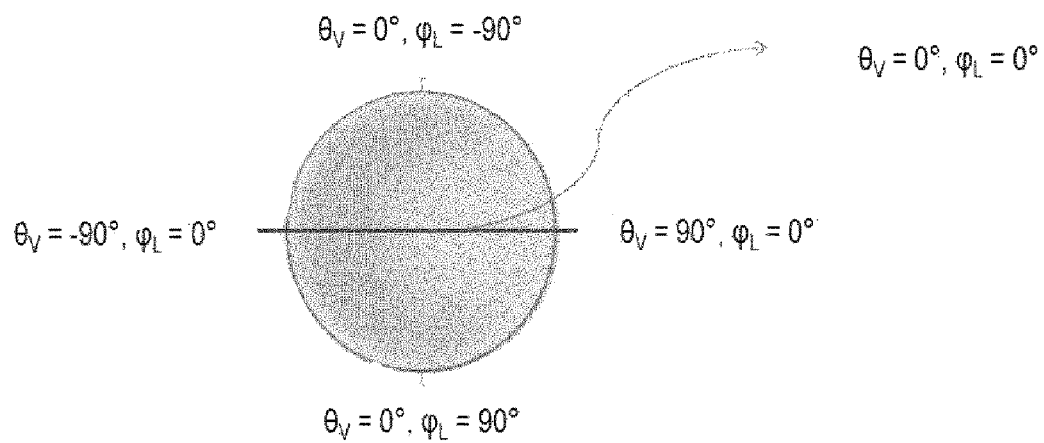

[FIG. 22]
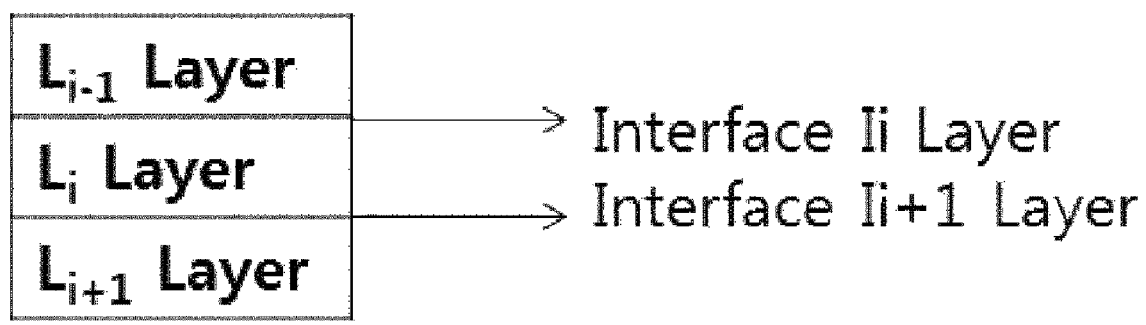

DECORATION MEMBER AND METHOD FOR MANUFACTURING DECORATION MEMBER

This application is a National Stage Application of International Application No. PCT/KR2018/002670 filed on Mar. 6, 2018, which claims priority to and the benefits of Korean Patent Application No. 10-2017-0028261, filed with the Korean Intellectual Property Office on Mar. 6, 2017, Korean Patent Application No. 10-2017-0136790, filed with the Korean Intellectual Property Office on Oct. 20, 2017, and Korean Patent Application No. 10-2017-0160298, filed with the Korean Intellectual Property Office on Nov. 28, 2017, the entire contents of which are incorporated herein by reference.

TECHNICAL FIELD

The present application relates to a decoration element and a method for preparing a decoration element.

BACKGROUND ART

With the development of information technology (IT), portable electronic devices and electronic goods have become diverse, and upon requests from users having increased interests in designs, interests in the appearances of portable electronic devices and electronic goods have increased.

Patent Document 1 relates to a method for preparing a decoration element for an electronic device using a pattern. Generally, a decoration element using a pattern displays one color, however, interests in a decoration element having dichroism expressing different colors depending on a viewing direction are also growing.

PRIOR ART DOCUMENTS

Patent Documents

Patent Document 1: Korean Patent No. 10-1652875

DISCLOSURE

Technical Problem

The present application is directed to providing a decoration element having dichroism expressing different colors depending on a viewing direction, and having improved visibility of the dichroism, and a method for preparing a decoration element.

Technical Solution

The present application relates to a decoration element. An illustrative decoration element may comprise a pattern layer comprising a surface having a plurality of convex portions, each of the convex portion comprising first and second inclined surfaces having different inclined angles, and an inorganic material layer formed on the top of the convex portions.

FIG. 1 to FIG. 3 each illustrate a decoration element comprising a pattern layer comprising a convex portion (P1)-shaped surface, and an inorganic material layer (not shown).

In the present specification, inclined angles (a2, a3) of the convex portion (P1) may mean angles formed by inclined surfaces (S1, S2) of the convex portion (P1) and a horizontal surface of the pattern layer. Unless particularly mentioned otherwise in the present specification, the first inclined surface may be defined as a left inclined surface of the convex portion, and the second inclined surface may mean a right inclined surface of the convex portion in the drawings.

The convex portion (P1) of the pattern layer may have a column shape in which a cross-section is polygonal and extended in one direction. In one embodiment, the cross-section of the convex portion (P1) may be a triangle or may have a shape further comprising a small concave portion on a tip portion (pointed part or vertex part) of the triangle.

An angle (a1) formed by the first inclined surface (S1) and the second inclined surface (S2) may be in a range of 80 degrees to 100 degrees. The angle (a1) may be specifically 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined surface and the second inclined surface. When the first inclined surface and the second inclined surface do not form a vertex with each other, the angle may mean an angle of a vertex in a state forming a vertex by virtually extending the first inclined surface and the second inclined surface.

A difference between the inclined angle (a2) of the first inclined surface and the inclined angle (a3) of the second inclined surface may be in a range of 30 degrees to 70 degrees in the convex portion (P1). The difference between the inclined angle (a2) of the first inclined surface and the inclined angle (a3) of the second inclined surface may be, for example, 30 degrees or greater, 35 degrees or greater, 40 degrees or greater or 45 degrees or greater, and may be 70 degrees or less, 65 degrees or less, 60 degrees or less or 55 degrees or less. Having the difference between the inclined angles of the first inclined surface and the second inclined surface in the above-mentioned range may be advantageous in terms of obtaining direction-dependent color expression.

A height (H1) of the convex portion (P1) may be from 5 μm to 30 μm. Having the convex portion height in the above-mentioned range may be advantageous in a production process aspect. In the present specification, the convex portion height may mean a shortest distance between the highest part and the lowest part of the convex portion based on the horizontal surface of the pattern layer.

A width (W1) of the convex portion (P1) may be from 10 μm to 90 μm. Having the convex portion width in the above-mentioned range may be advantages in a process aspect in processing and forming a pattern. The width of the convex portion (P1) may be, for example, 10 μm or greater, 15 μm or greater, 20 μm or greater or 25 μm or greater, and may be 90 μm or less, 80 μm or less, 70 μm or less, 60 μm or less, 50 μm or less, 40 μm or less or 35 μm or less.

A distance between the adjacent convex portions (P1) may be from 0 μm to 20 μm. The distance between the adjacent convex portions in the present specification may mean, in two adjacent convex portions, a shortest distance between a point where one convex portion ends and a point where another convex portion starts. When properly maintaining the distance between the adjacent convex portions, a phenomenon of a reflection area looking dark due to shading when a relatively bright color is to be obtained may be improved when looking at the decoration element from an inclined surface side of the convex portion having a larger inclined angle. Between the adjacent convex portions, a second convex portion with a smaller height compared to the convex portion may be present as to be described later.

The pattern layer has a flat portion on an opposite side surface of the surface forming the convex portion, and the flat portion may be formed on a substrate layer. As the substrate layer, a plastic substrate may be used. As the plastic substrate, triacetyl cellulose (TAC); cycloolefin copolymers (COP) such as norbornene derivatives; poly(methyl methacrylate (PMMA); polycarbonate (PC); polyethylene (PE); polypropylene (PP); polyvinyl alcohol (PVA); diacetyl cellulose (DAC); polyacrylate (Pac); polyether sulfone (PES); polyetheretherketone (PEEK); polyphenylsulfone (PPS), polyetherimide (PEI); polyethylene naphthalate (PEN); polyethylene terephtalate (PET); polyimide (PI); polysulfone (PSF); polyarylate (PAR), amorphous fluorine resins or the like may be used, however, the plastic substrate is not limited thereto.

The pattern layer may comprise a curable resin. As the curable resin, photocurable resins or thermocurable resins may be used. As the photocurable resin, ultraviolet curable resins may be used. Examples of the thermocurable resin may comprise silicone resins, silicon resins, furan resins, polyurethane resins, epoxy resins, amino resins, phenol resins, urea resins, polyester resins, melamine resins or the like, but are not limited thereto. Typical examples of the ultraviolet curable resin may comprise acrylic polymers such as polyester acrylate polymers, polystyrene acrylate polymers, epoxy acrylate polymers, polyurethane acrylate polymers or polybutadiene acrylate polymers, silicone acrylate polymers, alkyl acrylate polymers or the like, but are not limited thereto.

The pattern layer may be prepared by coating a curable resin composition on a substrate layer, compressing the result to a mold having a target pattern, and then curing the result. The mold may have, for example, a plate shape or a roll shape. As an example of the mold, a soft mold or a hard mold may be used.

A color dye may be further included inside or below the pattern layer. As the color dye, anthraquinone-based dyes, phthalocyanine-based dyes, thioindigo-based dyes, perinone-based dyes, isoxindigo-based dyes, methane-based dyes, monoazo-based dyes, 1:2 metal complex-based dyes and the like may be used.

When comprising the color dye inside the pattern layer, the dye may be added to the curable resin to be used. When further comprising the color dye below the pattern layer, a method of coating a layer comprising the dye above or below the substrate layer may be used.

The color dye content may be, for example, from 0 wt % to 50 wt %. The color dye content may determine transmittance and haze ranges of the pattern layer or the decoration element, and the transmittance may be, for example, from 20% to 90%, and the haze may be, for example, from 1% to 40%.

The inorganic material layer may give metal texture and depth of color when looking at the decoration element. The inorganic material layer allows an image of the decoration element to be seen in various colors depending on the viewing angle. This is due to the fact that the wavelength of light passing the pattern layer and reflected on the inorganic material layer surface changes depending on the wavelength of incident light.

The inorganic material layer may comprise a metal. Examples of the inorganic material layer may comprise one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and optionally one or more types of materials among carbon and carbon composites. The inorganic material layer may be a single layer or a multilayer comprising the material.

The inorganic material layer may have a refractive index of 0 to 8 for light having a 400 nm wavelength. The refractive index of the inorganic material layer being outside the above-mentioned range may not be proper since it becomes dark due to reduced reflected light. Specifically, the refractive index of the inorganic material layer may be 0 or greater, 1 or greater, 2 or greater, 3 or greater, 4 or greater or 4.5 or greater, and may be 8 or less, 7 or less, 6 or less or 6.5 or less.

The thickness of the inorganic material layer may be, for example, from 10 nm to 1 μm. The inorganic material layer having a thickness in the above-mentioned range may be advantageous in providing a decoration element having dichroism expressing different colors depending on a viewing direction and having improved visibility of the dichroism. The thickness of the inorganic material layer may be, for example, 10 nm or greater, 50 nm or greater or 100 nm or greater, and may be 1 μm or less, 800 nm or less, 600 nm or less, 400 nm or less or 300 nm or less. The decoration element may have dichroism expressing different colors depending on a viewing direction. The decoration element may improve visibility of the dichroism by transforming a surface shape of the pattern layer.

FIG. 1 illustrates a decoration element comprising a pattern layer according to a $1^{st}$ example of the present application. According to the $1^{st}$ example of the present application, the pattern layer surface may have a shape disposing a second convex portion (P2) having a smaller height compared to the convex portion between the adjacent convex portions (P1). Hereinafter, the convex portion stated prior to the second convex portion may be referred to as a first convex portion. As described above, the distance between convex portions may be maintained in order to improve a phenomenon of a reflection area looking dart due to shading. However, when a flat portion is present between the adjacent convex portions, there is a problem of the flat portion being recognized as stripes, and disposing a second convex portion having a smaller height between the first convex portions as above may resolve such a problem. Such a decoration element may embody different colors in three directions of a side having a large inclined angle, a side having a small inclined angle and a front.

A height (H2) of the second convex portion (P2) may be in a range of ⅕ to ¼ of the height (H1) of the first convex portion (P1). For example, a height difference (H1−H2) between the first convex portion and the second convex portion may be from 10 μm to 30 μm. A width (W2) of the second convex portion may be from 1 μm to 10 μm. Specifically, the width (W2) of the second convex portion may be 1 μm or greater, 2 μm or greater, 3 μm or greater, 4 μm or greater or 4.5 μm or greater, and may be 10 μm or less, 9 μm or less, 8 μm or less, 7 μm or less, 6 μm or less or 5.5 μm or less.

The second convex portion may have two inclined surfaces (S3, S4) having different inclined angles. An angle (a4) formed by the two inclined surfaces of the second convex portion may be from 20 degrees to 100 degrees. Specifically, the angle (a4) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a6–a5) between both inclined surfaces of the second convex portion may be from 0 degrees to 60 degrees. The inclined angle difference (a6–a5) may be 0 degrees or greater, 10 degrees or greater, 20 degrees or greater, 30 degrees or greater, 40 degrees or greater or 45 degrees or greater, and may be 60 degrees or less or 55 degrees or less. The second convex portion having a dimension in the above-mentioned range may be advantageous in terms of forming bright color by increasing light inflow from a side surface having a large inclined surface angle.

FIG. 2 illustrates a decoration element comprising a pattern layer according to a $2^{nd}$ example of the present application. According to the $2^{nd}$ example of the present application, the pattern layer surface may have a shape further comprising a concave portion (P3) having a smaller height compared to the convex portion on a tip portion (pointed part) of the convex portion (P1). Such a decoration element may exhibit an effect of an image color softly changing depending on a viewing angle.

A height (H3) of the concave portion (P3) may be from 3 μm to 15 μm. Specifically, a height (H3) of the concave portion (P3) may be 3 μm or greater, and may be 15 μm or less, 10 μm or less or 5 μm or less. The concave portion may have two inclined surfaces (S5, S6) having different inclined angles. An angle (a7) formed by the two inclined surfaces of the concave portion may be from 20 degrees to 100 degrees. Specifically, the angle (a7) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a9–a8) between both inclined surfaces of the concave portion may be from 0 degrees to 60 degrees. The inclined angle difference (a9–a8) may be 0 degrees or greater, 10 degrees or greater, 20 degrees or greater, 30 degrees or greater, 40 degrees or greater or 45 degrees or greater, and may be 60 degrees or less or 55 degrees or less. The concave portion having a dimension in the above-mentioned range may be advantageous in terms that a color sense may be added on the inclined surface.

FIG. 3 illustrates a decoration element comprising a pattern layer according to a $3^{rd}$ example of the present application. According to the $3^{rd}$ example of the present application, as illustrated in FIG. 3(a), the pattern layer surface may have a shape of a plurality of convex portions being arranged in an inversed phase structure of 180 degrees. Specifically, the pattern layer surface may comprise a first area (C1) in which the second inclined surface has a larger inclined angle compared to the first inclined surface, and a second area (C2) in which the second inclined surface has a larger inclined angle compared to the first inclined surface. In one example, the convex portion included in the first area may be referred to as a first convex portion (P1), and the convex portion included in the second area may be referred to as a fourth a convex portion (P4). As for heights, widths, inclined angles and an angle formed by the first and the second inclined surfaces of the first convex portion (P1) and the fourth convex portion (P4), descriptions provided in the convex portion (P1) section may be used in the same manner. As illustrated in FIG. 3(b), it may be constituted that any one area of the first area and the second area corresponds to an image or a logo, and the other area corresponds to a background part. Such a decoration element may exhibit an effect of an image or logo color softly changing depending on a viewing angle. In addition, a decorative effect of colors of an image or logo part and a background part looking switched depending on a viewing direction.

The first area and the second area may each comprise a plurality of convex portions. Widths and the number of convex portions of the first area and the second area may be properly controlled depending on the size of a target image or logo.

The present application also relates to a method for preparing a decoration element. FIG. 4 illustrates a method for preparing a decoration element of the present application. The illustrative preparation method may comprise, in a pattern layer comprising a surface having a plurality of convex portions, each of the convex portion comprising first and second inclined surfaces having different inclined angles, depositing first and second inorganic material layers on the first and the second inclined surfaces, respectively.

The illustrative preparation method deposits each of the inorganic material layers on the two inclined surfaces of the pattern layer, and therefore, a thickness and a type of the inorganic material layer on each of the inclined surfaces may be controlled, and therefore, a spectrum of dichroism may be widened. Unless particularly described otherwise in the preparation method, descriptions provided in the decoration element section may be used in the same manner.

The first and the second inorganic material layers may be deposited on the top of the first and the second inclined surfaces, respectively, using a sputter method or an evaporation method. Particularly, the sputter method has straightness, and therefore, a difference in the deposition thicknesses of both inclined surfaces of the convex portion may be maximized by tilting a position of a target.

In one embodiment, of the first and the second inclined surfaces of the pattern layer (10), the first inorganic material layer (201) may be deposited after tilting toward the inclined surface having a smaller inclined angle (S1), and then the second inorganic material layer (202) may be deposited after tilting toward the inclined surface having a larger inclined angle (S2). Such a process order (S1 and S2) may be reversed, and the process may be advantageous in terms that inorganic materials having different thicknesses may be deposited on both inclined surfaces.

The first and the second inorganic material layers may be deposited on the top of the first and the second inclined surfaces to different thicknesses. The thicknesses of the first and the second inorganic material layers may each be properly controlled within the range described in the decoration element section depending on target visual properties.

The first and the second inorganic material layers may be deposited on the top of the first and the second inclined surfaces using different materials. The materials of the first and the second inorganic material layers may each be properly controlled considering target visual properties in the materials in the decoration element section.

The inorganic material layer may be formed in a single layer, or may also be formed in a multilayer of two or more layers.

The inorganic material layer may comprise a third inorganic material layer and a fourth inorganic material layer consecutively laminated on the top of the convex portion. Materials included in each layer may be the same as or different from each other. In addition, the materials of the third and the fourth inorganic material layers may comprise the materials of the inorganic material layers described above. The third inorganic material layer may be expressed as a light absorbing layer, and the fourth inorganic material layer may be expressed as a light reflective layer.

The light absorbing layer and the light reflective layer may be formed in a single layer, or may also be formed in a multilayer of two or more layers.

In the light absorbing layer, light absorption occurs in an incident path and a reflection path of light, and in addition thereto, lights each reflect on a surface of the light absorbing layer and on an interface between the light absorbing layer and the light reflective layer, and the two reflected lights go through constructive or destructive interference.

The light reflected on a surface of the light absorbing layer may be expressed as surface reflected light, and the light reflected on an interface between the light absorbing layer and the light reflective layer may be expressed as interface reflected light.

According to one embodiment, the convex portion shape or the concave portion shape on the pattern layer surface may be a cone-type convex portion protruded to an outer side of the pattern layer surface or a cone-type concave portion dent to an inner side of the pattern layer surface.

The cone type comprises a shape of a circular cone, an oval cone, or a polypyramid. Herein, the shape of the bottom surface of the polypyramid comprises a triangle, a square, a star shape having 5 or more protruding points, and the like. According to one embodiment, when the pattern layer surface has a cone-type convex portion shape when placing the decoration element on the ground, at least one of the vertical cross-sections with respect to the ground of the convex portion shape may be a triangle shape. According to another embodiment, when the pattern layer surface has a cone-type concave portion shape when placing the decoration element on the ground, at least one of the vertical cross-sections with respect to the ground of the concave portion shape may be an inversed triangle shape.

According to one embodiment, the cone-type convex portion or cone-type concave portion shape may have at least one asymmetric-structured cross-section. For example, when observing the cone-type convex portion or concave portion from a surface side of the convex portion or concave portion shape, the presence of 2 or less of the same shape when rotating 360 degrees based on a vertex of the cone is advantageous in developing dichroism. FIG. 7 illustrates the cone-type convex portion shape observed from a surface side of the convex portion shape, and (a) all illustrates symmetric-structured cone types and (b) all illustrates asymmetric-structured cone types.

When placing the decoration element on the ground, the symmetric-structured cone type has a structure in which a cross-section in a direction horizontal to the ground (hereinafter, referred to as a horizontal cross-section) is circle or a regular polygon having the same side lengths, and the vertex of the cone is present on the line perpendicular to the cross-section of the center of gravity of the horizontal cross-section with respect to the ground. However, the cone type having an asymmetric-structured cross-section has a structure in which, when observing from a surface side of the cone-type convex portion or concave portion shape, the position of the vertex of the cone is present on the vertical line of the point that is not the center of gravity of the horizontal cross-section of the cone, or has a structure in which the horizontal cross-section of the cone is an asymmetric-structured polygon or an oval. When the horizontal cross-section of the cone is an asymmetric-structured polygon, at least one of the sides and the angles of the polygon may be designed to be different from the rest.

For example, as in FIG. 8, the position of the vertex of the cone may be changed. Specifically, when designing the vertex of the cone to be located on the vertical line of the center of gravity (01) of the horizontal cross-section with respect to the ground of the cone when observing from a surface side of the cone-type convex portion shape as in the first drawing of FIG. 8, 4 identical structures may be obtained when rotating 360 degrees based on the vertex of the cone (4-fold symmetry). However, the symmetric structure is broken by designing the vertex of the cone on a position (02) that is not the center of gravity (01) of the horizontal cross-section with respect to the ground. When employing a length of one side of the horizontal cross-section with respect to the ground as x, migration distances of the vertex of the cone as a and b, a height of the cone type, a length of a line virtually connecting from the vertex of the cone (01 or 02) to the horizontal cross-section with respect to the ground, as h, and an angle formed by the horizontal cross-section and a side surface of the cone as θn, cosine values for Surface 1, Surface 2, Surface 3 and Surface 4 of FIG. 8 may be obtained as follows.

$$\cos(\Theta 1) = \frac{\left(\frac{x}{2}\right)}{sqrt\left(h^2 + \left(\frac{x}{2}\right)^2\right)}$$

$$\cos(\Theta 2) = \frac{\left(\frac{x}{2}\right)}{sqrt\left(h^2 + \left(\frac{x}{2}\right)^2\right)}$$

$$\cos(\Theta 3) = \frac{\left(\frac{x}{2} - a\right)}{sqrt\left(h^2 + \left(\frac{x}{2} - a\right)^2\right)}$$

$$\cos(\Theta 4) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference between two colors (E*ab), and therefore, dichroism may be obtained. Herein, |θ3−θ4|>0. As above, how much the symmetric structure is broken, that is, a degree of asymmetry, may be represented quantitatively using an angle formed by the horizontal cross-section with respect to the ground and a side surface of the cone, and the value representing such a degree of asymmetry is proportional to a color difference of dichroism.

According to another embodiment, the pattern layer has a surface of a convex portion shape in which the highest point has a line shape or a concave portion shape in which the lowest point has a line shape. FIG. 10 to FIG. 12 show images of examples obtaining a line-shaped convex portion. The line shape may be a straight-line shape or a curved-line shape, and may comprise both a curved line and a straight line or a zigzag shape. When observing the surface of the convex portion shape in which the highest point has a line shape or the concave portion shape in which the lowest point has a line shape from a surface side of the convex portion or concave portion shape, having only one identical shape when rotating 360 degrees based on the center of gravity of the horizontal cross-section with respect to the ground of the convex portion or concave portion is advantageous in developing dichroism. FIG. 9 illustrates a surface having a convex portion shape in which the highest point has a line shape, and (a) illustrates a pattern having a convex portion developing no dichroism and (b) illustrates a pattern having a convex portion developing dichroism. An X-X' cross-section of FIG. 9(a) is an isosceles triangle or an equilateral triangle, and a Y-Y' cross-section of FIG. 9(b) is a triangle having different side lengths.

According to another embodiment, the pattern layer has a surface of a convex portion or concave portion shape in which a cone-type tip portion is cut. FIG. 13 illustrates images obtaining, when placing a decoration element on the ground, an inversed trapezoidal concave portion in which a cross-section perpendicular to the ground is asymmetric. Such an asymmetric cross-section may have a trapezoidal or inversed trapezoidal shape. In this case, dichroism may also be developed by the asymmetric-structured cross-section.

FIG. 6 illustrates a decoration element comprising a pattern layer according to a 4th example of the present application. According to the 4th example of the present application, as illustrated in FIG. 6, a decoration element in which the inorganic material layer has a multilayer structure is presented. Specifically, a light absorbing layer (401) and a light reflective layer (501) consecutively formed on the top of the convex portion of the pattern layer may be included. Herein, t1, a thickness of the light reflective layer in area E of the pattern layer comprising the first inclined surface, and t2, a thickness of the light reflective layer in area F of the pattern layer comprising the second inclined surface, may be the same as or different from each other. FIG. 6 relates to a light absorbing layer having inclined surfaces facing each other, that is, cross-sections, being a triangle structure. In the structure of the pattern having inclined surfaces facing each other as in FIG. 6, thicknesses of the light absorbing layer may be different in two surfaces of the triangle structure even when progressing deposition under the same condition. Accordingly, a light absorbing layer having two or more areas with different thicknesses may be formed using just one process. As a result, developed colors may become different depending on the thickness of the light absorbing layer. Herein, the thickness of the light reflective layer does not affect changes in the color when it is a certain thickness or greater.

The light reflective layer is not particularly limited as long as it is a material capable of reflecting light, however, light reflectance may be determined depending on the material, and for example, colors are readily expressed at 50% or greater. Light reflectance may be measured using an ellipsometer.

The light absorbing layer preferably has a refractive index (n) of 0 to 8 at 400 nm, and the refractive index may be from 0 to 7, may be from 0.01 to 3, and may be from 2 to 2.5. The refractive index (n) may be calculated by $\sin \theta 1/\sin \theta 2$ ($\theta 1$ is an angle of light incident on a surface of the light absorbing layer, and $\theta 2$ is a refraction angle inside the light absorbing layer).

The light absorbing layer may have an extinction coefficient (k) of greater than 0 and less than or equal to 4 at 400 nm, and the extinction coefficient (k) is preferably from 0.01 to 4, may be from 0.01 to 3.5, may be from 0.01 to 3, and may be from 0.1 to 1. The extinction coefficient (k) is $-\frac{1}{4}pI(dI/dx)$ (herein, a value multiplying $\frac{1}{4}p$ with $dI/I$, a reduced fraction of light intensity per a path unit length ($dx$), for example 1 m, in the light absorbing layer, and herein, 1 is a wavelength of light).

The light absorbing layer may have an extinction coefficient (k) of greater than 0 and less than or equal to 4 at 380 nm to 780 nm, and the extinction coefficient (k) is preferably from 0.01 to 4, may be from 0.01 to 3.5, may be from 0.01 to 3, and may be from 0.1 to 1. The extinction coefficient (k) is in the above-mentioned range at 400 nm, preferably in the whole visible wavelength region of 380 to 780 nm, and therefore, a role of a light absorbing layer may be performed in the visible range.

Even when having the same refractive index (n) value, a difference of $\Delta E^*ab=\sqrt{\{(\Delta L)^2+(\Delta a)^2+(\Delta b)^2\}}>1$ may be obtained when the extinction coefficient (k) value is 0 and when the extinction coefficient (k) value is 0.01 at 380 nm to 780 nm. For example, when simulating a case of irradiating D65 (solar spectrum) as a light source on a lamination structure of glass/aluminum/aluminum oxide/air layer, E*ab values when the k values of the aluminum oxide are 0 and 0.01 are obtained as in the following Table 1. Herein, the thickness (h1) of the aluminum layer is 120 nm, and the thickness (h2) of the aluminum oxide layer is described in the following Table 1. The k values are arbitrarily set at 0 and 0.01 for the simulation, and as the n value, the value of aluminum is used.

TABLE 1

| h2 [nm] | k = 0 | | | k = 0.01 | | | |
|---|---|---|---|---|---|---|---|
| | L | A | b | L | A | b | ΔE * ab |
| 40 | 6.63 | 1.75 | −1.25 | 85.18 | 2.09 | 0.03 | 1.96 |
| 60 | 9.83 | −4.02 | −8.30 | 87.86 | −4.06 | −9.01 | 2.10 |
| 80 | 5.60 | −1.87 | −2.58 | 94.44 | −2.05 | −2.86 | 1.20 |

According to one embodiment, the light reflective layer may be a metal layer, a metal oxynitride layer or an inorganic material layer. The light reflective layer may be formed in a single layer, or may be formed in a multilayer of two or more layers. As one example, the light reflective layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and optionally one or more types of materials among carbon and carbon composites. For example, the light reflective layer may comprise two or more alloys selected from among the above-mentioned materials, or oxides, nitrides or oxynitrides thereof. For example, the light reflective layer may comprise two or more alloys selected from among the above-mentioned metals. More specifically, the light reflective layer may comprise molybdenum, aluminum or copper. According to another embodiment, the light reflective layer may allow highly resistant reflective layer by being prepared using an ink comprising carbon or carbon composite. Carbon black, CNT and the like may be included as the carbon or carbon composite. The ink comprising carbon or carbon composite may comprise above-described materials, or oxides, nitrides or oxynitrides thereof, and for example, one, two or more types of oxides selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag) may be included. A curing process may be further carried out after printing the ink comprising carbon or carbon composite. When the light reflective layer comprises two or more types of materials, the two or more types of materials may be formed using one process, for example, a method of deposition or printing, however, a method of first forming a layer using one or more types of materials, and then additionally forming a layer thereon using one or more types of materials may be used. For example, a light reflective layer may be formed by forming a layer through depositing indium or tin, then printing an ink comprising carbon, and then curing the result. The ink may further comprise oxides such as titanium oxides or silicon oxides.

According to one embodiment, the light absorbing layer may be a single layer, or a multilayer of two or more layers. The light absorbing layer may be formed with materials having an extinction coefficient (k) at 380 nm to 780 nm, that is, materials having an extinction coefficient of greater than 0 and less than or equal to 4, and preferably 0.01 to 4. For example, the light absorbing layer may comprise one, two or more selected from the group consisting of metals, metalloids, and oxides, nitrides, oxynitrides and carbides of metals or metalloids. The oxides, nitrides, oxynitrides or carbides of metals or metalloids may be formed under a deposition condition and the like set by those skilled in the art. The light absorbing layer may also comprise the same metals, metalloids, alloys or oxynitrides of two or more types as the light reflective layer.

For example, the light absorbing layer may be a single layer or a multilayer comprising one, two or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof. As specific examples, the light absorbing layer comprises one, two or more types selected from among copper oxides, copper nitrides, copper oxynitrides, aluminum oxides, aluminum nitrides, aluminum oxynitrides and molybdenum titanium oxynitrides.

According to one embodiment, the light absorbing layer comprises silicon (Si) or germanium (Ge).

The light absorbing layer formed with silicon (Si) or germanium (Ge) may have a refractive index (n) of 0 to 8, or 0 to 7 at 400 nm, and may have an extinction coefficient (k) of greater than 0 and less than or equal to 4, preferably 0.01 to 4, and the extinction coefficient (k) may be from 0.01 to 3 or from 0.01 to 1.

According to one embodiment, the light absorbing layer is AlOxNy (x>0, y>0).

According to another embodiment, the light absorbing layer may be AlOxNy (0≤x≤1.5, 0≤y≤1).

According to another embodiment, the light absorbing layer is AlOxNy (x>0, y>0), and with respect to the total atom number 100%, the number of each atom satisfies the following equation.

$$1 < \frac{(Al)_{at} \times 3}{(O)_{at} \times 2 + (N)_{at} \times 3} < 2$$

According to one embodiment, the light absorbing layer may be formed with materials having an extinction coefficient (k) at 400 nm, preferably at 380 to 780 nm, and for example, the light absorbing layer/light reflective layer may be formed with materials such as CuO/Cu, CuON/Cu, CuON/Al, AlON/Al, AlN/AL/AlON/Cu or AlN/Cu.

According to one embodiment, the thickness of the light reflective layer may be determined depending on target color in a final structure, and for example, may be 1 nm or greater, preferably 25 nm or greater, for example, 50 nm or greater, and preferably 70 nm or greater.

According to one embodiment, the thickness of the light absorbing layer may be from 5 nm to 500 nm, for example, from 30 nm to 500 nm. The illustrative decoration element and the illustrative method for preparing a decoration element may be used in known subjects requiring the use of a decoration element. For example, they may be used without limit in portable electronic devices, electronic goods and the like.

In the present application, the light absorbing layer and the light reflective layer are named by the function. For light having a specific wavelength, a layer reflecting light relatively more may be expressed as the light reflective layer, and a layer reflecting light relatively less may be expressed as the light absorbing layer.

Through FIG. 22, the light absorbing layer and the light reflective layer are described. In the decoration element of FIG. 22, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Mathematical Equation 1]}$$

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defining how strongly a subject material absorbs light at a specific wavelength, and the definition is as described above.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380nm}^{\lambda=780nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380nm}^{\lambda=780nm} \Delta\lambda} \quad \text{[Mathematical Equation 2]}$$

Herein, when $R_i$ of $I_i$ is the largest among the interfaces of a laminate, a layer located adjoining the interface $I_i$, and facing the interface $I_i$ in a light entering direction may be defined as the light reflective layer, and the remaining layers may be defined as the light absorbing layer. For example, in the laminate illustrated in FIG. 22, when a sum of reflectance for each wavelength at the interface $I_{i+1}$ is the largest, the $L_{i+1}$ layer located adjoining the interface $I_{i+1}$, and facing the interface $I_{i+1}$ in a light entering direction may be defined as the light reflective layer, and the remaining $L_{i-1}$ layer and $L_i$ layer may be defined as the light absorbing layer.

A method of using the decoration element in portable electronic devices or electronic goods is not particularly limited, and known methods known as a method of using a deco film in portable electronic devices or electronic goods in the art may be used. In one example, the decoration element may be used in portable electronic devices or electronic goods by direct coating. In this case, a separate gluing layer for attaching the decoration element to the portable electronic devices or the electronic goods may not be required. In another example, the decoration element may be attached to portable electronic devices or electronic goods using a gluing layer as a medium. As the gluing layer, an optically clear adhesive tape (OCA tape) or an adhesive resin may be used. As the OCA tape or the adhesive resin, OCA tapes or adhesive resins known in the art may be used without limit.

Advantageous Effects

The present application provides a decoration element having dichroism expressing different colors depending on a viewing direction, and having improved visibility of the dichroism, and a method for preparing a decoration element.

DESCRIPTION OF DRAWINGS

FIG. 1 illustrates a decoration element of the present specification.

FIG. 2 illustrates a decoration element of the present specification.

FIG. 3 illustrates a decoration element of the present specification, and left and right views.

FIG. 4 illustrates a method for preparing a decoration element of the present specification.

FIG. 5 shows a visual evaluation result of dichroism of Example 1.

FIG. 6 illustrates a lamination structure of a decoration element according to one embodiment of the present specification.

FIGS. 7 to 9 illustrate an upper surface structure of a light absorbing layer of a decoration element.

FIGS. 10 to 14 are examples of a surface of a convex portion or concave portion shape of a pattern layer according to several embodiments.

FIGS. 15 and 16 show results of observing structures and colors of decoration elements of Examples 5 to 7.

FIGS. 17 and 18 show experimental results according to Evaluation Example 2.

FIG. 19 is a graph presenting n and k values of aluminum oxynitride.

FIGS. 20 and 21 are diagrams introduced for describing a color coordinate system.

FIG. 22 is a diagram introduced for describing a light absorbing layer and a light reflective layer.

Three numbers shown in the color of FIG. 16 are L*ab coordinate values of the color.

MODE FOR DISCLOSURE

Hereinafter, the present application will be specifically described with reference to examples, however, the scope of the present application is not limited by the following examples.

Example 1

A hard mold was processed so as to have a pattern of a structure of FIG. 1. A pattern layer having a structure of FIG. 1 was formed by coating a composition comprising an epoxy resin and a phthalocyanine-based dye on a substrate layer, compressing the hard mold and then curing with ultraviolet rays. A decoration element was prepared by depositing aluminum to a thickness of 200 nm on the top of the pattern layer using a sputter method to form an inorganic material layer. A refractive index of the inorganic material layer for light having a wavelength of 400 nm was 5. In the prepared decoration element, both inclined angles of a first convex portion were each 20 degrees and 70 degrees and the width was 30 μm, and both inclined angles of a second convex portion were each 20 degrees and 70 degrees and the width was 5 μm. Heights of the first and the second convex portions were each determined from the width and the inclined angle.

Example 2

A decoration element was prepared in the same manner as in Example 1 except that soft and hard molds were processed so as to have a pattern of a structure and of FIG. 2. In the prepared decoration element, both inclined angles of a convex portion were each 20 degrees and 70 degrees and the width was 30 μm, and both inclined angles of a concave portion were each 20 degrees and 70 degrees and the height was 3 μm. A height of the convex portion was determined from the width and the inclined angle, and a width of the concave portion was determined from the height and the inclined angle.

Example 3

A decoration element was prepared in the same manner as in Example 1 except that soft and hard molds were processed so as to have a pattern of a structure and of FIG. 3. In the prepared decoration element, both inclined angles of a first convex portion of a convex portion of a first area were each 20 degrees and 70 degrees and the width was 30 μm, and a convex portion of a second area had an inversed structure of 180 degrees with the convex portion of the first area, and both inclined angles were each 70 degrees and 20 degrees.

Example 4

A decoration element was prepared in the manner of FIG. 4 using a sputter method. A pattern layer was prepared in the same manner as in Example 1, and a first inorganic material layer was formed by depositing molybdenum to a thickness of 100 nm by tilting toward a first inclined surface of the pattern layer, and then a second inorganic material layer was formed by depositing aluminum to a thickness of 300 nm by tilting toward a second inclined surface.

Examples 5 to 7

After forming a pattern (FIG. 12) by coating an ultraviolet curable resin on a PET substrate layer, an $AlO_xN_y$ ($0 \leq x$, $0.1 \leq y \leq 1$) light absorbing layer was formed on the pattern of the substrate using a reactive sputtering method by adding nitrogen. On the light absorbing layer, Al having a thickness of 100 nm was deposited using a sputtering method to form a light reflective layer (Al, thickness 120 nm).

The pattern shape was formed in a structure repeating an asymmetric prism structure as in FIG. 15, and a sample was prepared by employing an inclined angle on one side surface of the pattern as 60°, and an inclined angle on the other side as 40° (Example 5), 30° (Example 6) and 20° (Example 7).

Herein, a pitch of the patterns was 100 micrometers, and a height of the pattern was 25 micrometers. Light entered to the substrate side of the obtained sample, passed through the light absorbing layer, and light reflected on the light reflective layer may be observed from the substrate side. The thickness and the color of the light absorbing layer observed from the obtained sample are shown in FIG. 16. n and k values of the aluminum oxynitride layer are described in FIG. 19.

Comparative Example 1

After forming a pattern (FIG. 12) by coating an ultraviolet curable resin on a PET substrate layer, an $AlO_xN_y$ ($0 \leq x$, $0.1 \leq y \leq 1$) light absorbing layer was formed on the pattern of the substrate using a reactive sputtering method by adding nitrogen. On the light absorbing layer, Al having a thickness of 100 nm was deposited using a sputtering method to form a light reflective layer (Al, thickness 120 nm).

The pattern shape was formed in a structure repeating a symmetric prism structure, and an inclined angle on one side surface of the pattern was 45°, and an inclined angle on the other side was the same as 45°. Herein, a pitch of the patterns was 100 micrometers, and a height of the pattern was 25 micrometers. Light entered to the substrate side of the obtained sample, passed through the light absorbing layer, and light reflected on the light reflective layer may be observed from the substrate side.

Evaluation Example 1 Visual Evaluation of Dichroism

A visual evaluation of dichroism was performed for Examples 1 to 4 and Comparative Example 1 using a visual examination method. FIG. 5(a) and FIG. 5(b) are each an image of a right side view and a left side view of Example 1.

Evaluation Example 2 Visual Evaluation of Dichroism

FIG. 15 shows viewing angle-dependent color changes in the decoration element according to Example 1 and the decoration element according to Comparative Example 1.

It was identified that, whereas the decoration element according to Example 1 exhibited dichroism expressing different colors depending on a viewing angle, the decoration element according to Comparative Example 1 expressed just one color.

FIG. 16 measures and compares brightness values (L*), color values (*a) and saturation values (*b) of the decoration element according to Example 1 and the decoration element according to Comparative Example 1 in CIE L*a*b color space depending on a viewing angle.

In Example 1, it was identified that the brightness value (L*) and the saturation value (*b) significantly changed as the viewing angle changed.

Meanwhile, in Comparative Example 1, it was identified that the brightness value (L*) and the saturation value (*b) did not significantly change even when the viewing angle changed.

In the drawing, the color when looking at the decoration element in a viewing angle coordinate system is presented. The coordinate may be represented by (θ, φ). When employing a direction perpendicular to a surface direction of the decoration element as an x axis, and any one direction of the surface direction of the decoration element as an y axis, an angle formed by the x axis and the viewing direction is referred to as θ, and an angle formed by the y axis and the viewing direction is referred to as φ. When the φ is 0 degrees (θ, 0), L*, a* and b* values depending on the changes in the θ were measured. Details on the viewing angle coordinate system may be referred to a document IES type B Reference [IES-LM-75-01 Goniophotometer Types and Photometric Coordinates(title), IES(author), (Illuminating Engineering Society of North America, 2001)], and this is illustrated in FIG. 20.

In addition, the color of the decoration element is presented when θ and φ both changed. FIG. 21 presents an angle of the viewing angle coordinate system.

[Reference Numeral]

P1: Convex Portion or First Convex Portion P2: Second Convex Portion P3: Concave Portion, P4: Third Convex Portion 10: Pattern Layer 201: First Inorganic Material Layer 202: Second Inorganic Material Layer H1, H2, H3: Height W1, W2, W3: Width, S1, S2, S3, S4, S5, S6: Inclined Surface, a1, a4, a7: Vertex Angle, a2, a3, a5, a6, a8, a9: Inclined Angle C1: First Area C2: Second Area

The invention claimed is:

1. A decoration element comprising:
a pattern layer comprising a surface having a plurality of first convex portions, each of the first convex portions comprising first and second inclined surfaces having different inclined angles; and
an inorganic material layer formed on the top of the first convex portions,
wherein the decoration element has dichroism expressing different colors,
wherein the inorganic material layer comprises a first inorganic material layer on the top of the first inclined surface and a second inorganic material layer on the top of the second inclined surface,
wherein only the first inorganic material layer formed on the first inclined surface and only the second inorganic material layer formed on the inclined second surface,
wherein the first and the second inorganic material layers comprise different materials or have different thicknesses,
wherein the surface of the pattern layer further comprises a second convex portion having a smaller height compared to the first convex portion between the adjacent first convex portions,
wherein the height of the second convex portion is in a range of ⅕ to ¼ of the height of the first convex portion,
wherein a width of the first convex portion is from 15 μm to 90 μm, and
wherein a width of the second convex portion is from 1 μm to 10 μm.

2. The decoration element of claim 1, wherein an angle formed by the first inclined surface and the second inclined surface is in a range of 80 degrees to 100 degrees.

3. The decoration element of claim 1, wherein a difference in the inclined angles of the first inclined surface and the second inclined surface is in a range of 30 degrees to 70 degrees.

4. The decoration element of claim 1, wherein the pattern layer has a flat portion on an opposite side surface of the surface forming the first convex portion, and the flat portion is formed on a substrate layer.

5. The decoration element of claim 1, wherein the pattern layer comprises a thermocurable resin or an ultraviolet curable resin.

6. The decoration element of claim 1, further comprising a color dye inside or below the pattern layer.

7. The decoration element of claim 1, wherein each of the first inorganic material layer and the second inorganic material layer is a single layer or a multilayer comprising one or more types of materials selected from among indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co), gold (Au) and silver (Ag), or oxides, nitrides or oxynitrides thereof, and optionally one or more types of materials among carbon and carbon composites.

8. The decoration element of claim 1, wherein the surface of the pattern layer has a shape in which a tip portion of the first convex portion further comprises a concave portion having a smaller height compared to the first convex portion.

9. The decoration element of claim 8, wherein the concave portion has a shape comprising two inclined surfaces having different inclined angles.

10. The decoration element of claim 1, wherein the pattern layer comprises a first area in which the second inclined surface has a larger inclined angle compared to the first inclined surface, and a second area in which the second inclined surface has a larger inclined angle compared to the first inclined surface.

11. A method for preparing the decoration element of claim 1, the method comprising:

providing the pattern layer comprising the surface having the plurality of first convex portions, each of the first convex portions comprising first and second inclined surfaces having different inclined angles, and depositing the first and second inorganic material layers on the first and the second inclined surfaces, respectively, wherein the first and the second inorganic material layers are deposited using different materials or with different thicknesses.

12. The method for preparing a decoration element of claim 11, wherein the depositing of first and second inorganic material layers is carried out using a sputter method or an evaporation method.

* * * * *